United States Patent

[11] 3,571,735

[72] Inventors Jean Martial Ducamus
Paris, France;
Jacques Andrieu, Chevilly-larue, France

[21] Appl. No. 755,294
[22] Filed Aug. 26, 1968
[45] Patented Mar. 23, 1971
[73] Assignee Telecommunications Radioelectriques et Telephoniques T. R. T.
Paris, France
[32] Priority Aug. 25, 1967
[33] France
[31] 119,027

[54] DETECTION CIRCUIT INCLUDING COMPENSATION FOR THE THRESHOLD OF THE FORWARD CHARACTERISTIC OF A SEMICONDUCTOR JUNCTION
5 Claims, 3 Drawing Figs.

[52] U.S. Cl. .... 329/101, 307/310, 330/23, 329/178, 329/202, 329/205
[51] Int. Cl. .... H03d 1/18
[50] Field of Search .... 329/178, 179, 101, 102, 205, 202; 307/310; 330/23

[56] References Cited

UNITED STATES PATENTS

| | | | |
|---|---|---|---|
| 2,866,892 | 12/1958 | Barton | 329/101X |
| 3,003,122 | 10/1961 | Gerhard | 329/101X |
| 3,248,572 | 4/1966 | Widmer | 307/310X |
| 3,249,880 | 5/1966 | Sante | 329/101 |
| 3,275,941 | 9/1966 | Brechling | 307/310X |
| 3,382,445 | 5/1968 | Williams et al. | 330/23 |

OTHER REFERENCES

Yhap " Transistor with Small Temperature Dependance" I. B. M. Technical Disclosure Bulletin, Vol. 4, No. 10 page 60 Mar., 1962 307— 310

*Primary Examiner*—Alfred L. Brody
*Attorney*—Frank R. Trifari

ABSTRACT: A transistor detector circuit features a diode coupled in series with the base of the transistor to temperature compensate the circuit against temperature shifts in the base-emitter threshold voltage. A second transistor and a second diode can also be used for detecting signals of greater amplitude.

INVENTORS
JEAN M. DUCAMUS
JACQUES ANDRIEU
BY Frank R. Trifari
AGENT

INVENTORS.
GEAN MARTIAL DUCAMUS
JACQUES ANDRIEU
BY
AGENT

DETECTION CIRCUIT INCLUDING COMPENSATION FOR THE THRESHOLD OF THE FORWARD CHARACTERISTIC OF A SEMICONDUCTOR JUNCTION

This invention relates to a circuit arrangement including compensation for the threshold of the forward characteristic of a semiconductor junction, which circuit comprises the series-combination of an element which supplies a signal, of a detection element in the form of the said semiconductor junction, and of a passive filter circuit.

As is well-known, the current-voltage forward characteristic of a semiconductor junction shows a knee below which the current increases only slightly with increasing voltage. Beyond this knee, which forms a threshold with increasing voltage, the current increases more proportionally. The position of this threshold varies considerably with temperature; for silicon, for example, an increase by 1° at 300° K. involves a 16 percent increase in the current.

Especially when signals with a small amplitude have to be detected a constant bias voltage has to be applied, which brings the signal to be detected on the level of said threshold. If due to temperature variations said threshold would shift, said bias must shift in fact in the same manner. This is difficult to achieve with a temperature dependent resistor due to the fact that the current flowing through the detection element on the stage of said threshold is only small. The voltage variation across such a temperature dependent resistor for such small currents is too small in order to compensate for the shift of the threshold upon temperature variations.

It is an object of the present invention to provide a detection circuit for solving the problem inherent in the threshold of the forward characteristic of a semiconductor diode.

In order to achieve this the detection circuit of the present invention is characterized in that the detector element is constituted by the base-emitter semiconductor junction of a transistor and that a compensating semiconductor diode is connected between the element which supplies the signal and the base electrode of the transistor, the common point of the said compensation semiconductor diode and the base electrode of the transistor being connected through a resistor to a bias-voltage source.

In order that the invention may be readily carried into effect, it will now be described in detail, by way of example, with reference to the accompanying diagrammatic drawing, in which.

Figure 1:
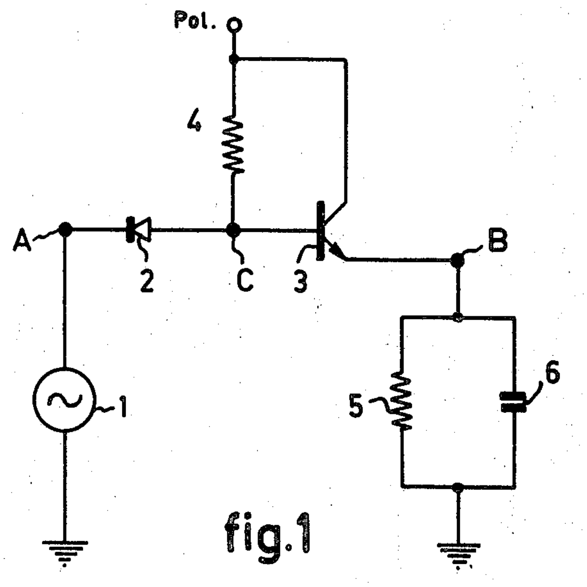
FIG. 1 shows the circuit diagram of a circuit arrangement in accordance with the invention.

The circuit diagram of FIG. 1 shows the series-combination of a member 1 which supplies a signal, a compensation semiconductor diode 2, a transistor 3, in this example of the nontype, the emitter-base junction of which is used as a detection element, and a passive filter circuit which comprises the parallel combination of a resistor 5 and a capacitor 6 and which forms an RC-filter circuit. The point C situated between the diode 2 and the base electrode of the transistor 3 is connected through a resistor 4 to a bias-voltage source labeled "-Pol." The collector of transistor 3 is directly connected to this source.

Assuming the threshold voltage of the compensation diode 2 to be equal to the threshold voltage of the detector junction, the voltages at points A and B will be equal when the diode 2 and the emitter-base junction of the transistor 3 are conducting. As a result, the detected voltage taken from the terminals of the detection circuit is exactly equal to the amplitude of the modulation voltage supplied by the element 1.

Thus, to ensure optimum operation of the circuit arrangement, the threshold voltages of the diode 2 and of the base-emitter junction of transistor 3 must be as equal as possible.

Figure 3:
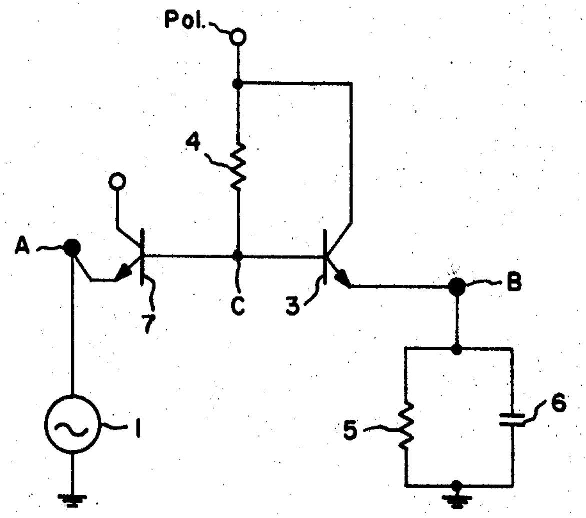
FIG. 3 shows still another modification of the circuit arrangement of FIG. 1.

This may be achieved:

a. by using as is shown in FIG. 3, wherein like reference numbers describe like elements, as the compensation diode 2 the emitter-base diode of a transistor 7 having the same characteristics as the transistor 3 the emitter-base junction of which is used as the detector element;

b. by proportioning the resistor 4 so that the average current flowing through it and through the diode 2 is equal to the emitter current of the transistor 3.

The compensation obtained with the circuit arrangement above described will be retained when the temperature varies; in fact, the thermal derivatives of the characteristics are the same for all the semiconductor elements.

However, the circuit arrangement shown in FIG. 1 has a drawback, namely the limitation of the maximum input level due to the breakdown voltage of the emitter-base diode of the transistors.

Figure 2:
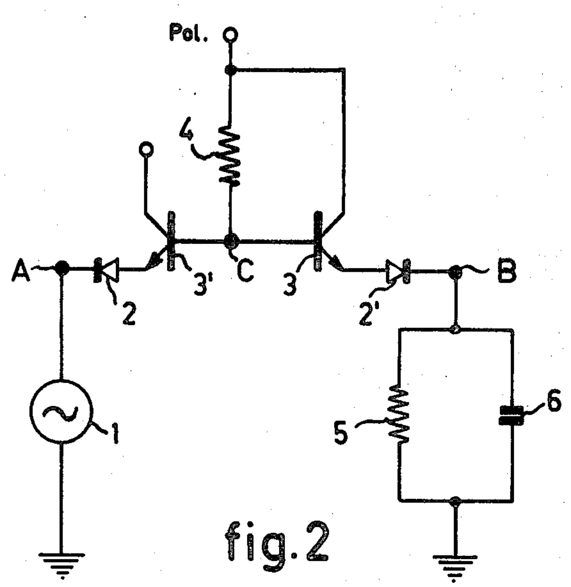
FIG. 2 shows a modification of the circuit arrangement of FIG. 1.

The circuit diagram of a modification of the invention, which is shown in FIG. 2, indicates how this drawback may be mitigated. Between the diode 2 and the point C, there is included a further diode, for example, in the form of the emitter-base diode of a transistor 3'. Also an additional diode 2' is connected between the transistor 3 and the point B.

Experiments have shown that the threshold voltage may be reduced to about 100 millivolts whereas initially it is of the order of 700 millivolts for a silicon diode.

Technical improvements are conceivable, more particularly consisting in the use of diodes and transistors from the same plate of an integrated circuit; this provides the advantage of a smaller difference between the threshold voltages of the various semiconductor elements, since the latter have been obtained by the same diffusion treatments, while also the temperatures of the various junctions are substantially the same.

I claim:

1. A detector circuit comprising means for receiving signals to be detected; means for detecting said signals comprising a first transistor having emitter, base, and collector electrodes; means for biasing said first transistor comprising a source of bias potential and a resistor coupled between said bias source and said base; means for compensating said transistor against temperature dependent threshold shifts comprising a first temperature compensating unidirectional conducting means serially coupled between said receiving means and said base; and means for filtering the detected output of said transistor coupled to said emitter.

2. A detector as claimed in claim 1, wherein said unidirectional conducting means comprises a first diode and a second transistor having emitter and base coupled to said first diode and said base of said first transistor respectively, and said temperature compensation means further comprises a second temperature compensating diode coupled between said emitter of said first transistor and said filter means.

3. A circuit as claimed in claim 1, wherein said filter comprises a resistor and a capacitor parallel coupled to each other.

4. A circuit as claimed in claim 1, wherein said unidirectional conducting means comprises the emitter-base junction of a third transistor.

5. A circuit as claimed in claim 1, wherein the current flowing through said bias resistor and diode is equal to the emitter current of said transistor.